(12) United States Patent
Inoue et al.

(10) Patent No.: US 6,677,664 B2
(45) Date of Patent: Jan. 13, 2004

(54) DISPLAY DRIVER INTEGRATED CIRCUIT AND FLEXIBLE WIRING BOARD USING A FLAT PANEL DISPLAY METAL CHASSIS

(75) Inventors: Hirokazu Inoue, Kanagawa (JP); Toyoshi Kawada, Kanagawa (JP); Yuji Sano, Kanagawa (JP); Michitaka Ohsawa, Kanagawa (JP); Osamu Hirohashi, Kawasaki (JP)

(73) Assignees: Fujitsu Hitachi Plasma Display Limited, Kawasaki (JP); Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 09/826,930

(22) Filed: Apr. 6, 2001

(65) Prior Publication Data

US 2001/0033009 A1 Oct. 25, 2001

(30) Foreign Application Priority Data

Apr. 25, 2000 (JP) .......................... 2000-123786
Jun. 30, 2000 (JP) .......................... 2000-198357

(51) Int. Cl.[7] ............................................. H01L 23/495
(52) U.S. Cl. .......................... 257/668; 349/58; 349/150
(58) Field of Search .................... 349/58, 82, 150, 349/60; 257/668, 666

(56) References Cited

U.S. PATENT DOCUMENTS 5,517,208 A * 5/1996 Mori et al. .................... 345/87
5,822,191 A * 10/1998 Tagusa et al. ............... 174/254

FOREIGN PATENT DOCUMENTS

| JP | 5-11183 | 2/1993 |
| JP | A-07211423 A | 8/1995 |
| JP | A-09146110 A | 6/1997 |
| JP | A-09244047 A | 9/1997 |
| JP | 4010260641 A | * 10/1998 |
| JP | A-11067832 A | 3/1999 |
| JP | A-11104805 A | 4/1999 |

* cited by examiner

Primary Examiner—Nathan J. Flynn
Assistant Examiner—Leonardo Andujar
(74) Attorney, Agent, or Firm—Staas & Halsey LLP (57) ABSTRACT

A low-cost display driver module that shortens the process for connecting an integrated circuit chip and a wiring pattern on a flexible wiring board and uses a metal chassis on a display panel as a radiator. In this display driver module, an integrated circuit chip with bump electrodes on it is joined with pressure applied by the use of an anisotropic conductive film, an anisotropic conductive paste, a non-conductive resin paste, or a non-conductive resin film and the back of the integrated circuit chip is adhered to a metal chassis on a display panel by the use of an integrated-circuit chip adhesive. As a result, the metal chassis can be used as a radiator for the integrated circuit chip. Batch bonding will enable to shorten time for the connection process and to cut down the cost of installations. Furthermore, a radiator is unnecessary, resulting in a low-cost display driver module.

7 Claims, 12 Drawing Sheets

DISPLAY DRIVER INTEGRATED CIRCUIT AND FLEXIBLE WIRING BOARD USING A FLAT PANEL DISPLAY METAL CHASSIS

BACKGROUND OF THE INVENTION (1) Field of the Invention

This invention relates to a display driver module and its mounting structure and, more particularly, to a display driver module having a driver integrated circuit for driving a large-screen flat panel display, such as a plasma display, and a wiring board on which this driver integrated circuit is mounted and being suitable for fixing this driver integrated circuit on a metal chassis on the flat panel display to radiate heat and a mounting structure for a portion where such a display driver module is mounted on a plasma display panel.

(2) Description of the Related Art

Attention is riveted to a large-screen flat panel display with a plasma display panel on it as the likeliest candidate for a next-generation large-size television because of its small depth, wide view angle, and easiness of making a large screen. These are the merits of an ordinary flat display.

Figure 10:
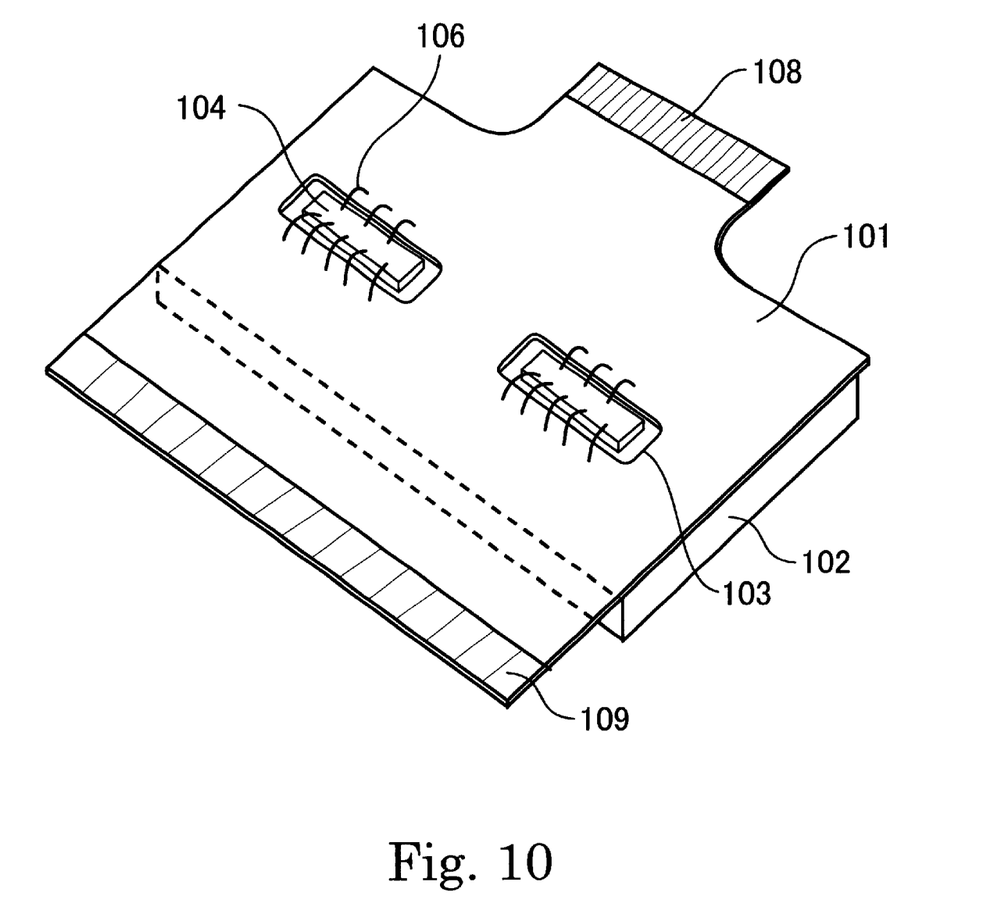
FIG. 10 is a perspective view showing an example of a conventional display driver module.
Figure 11:
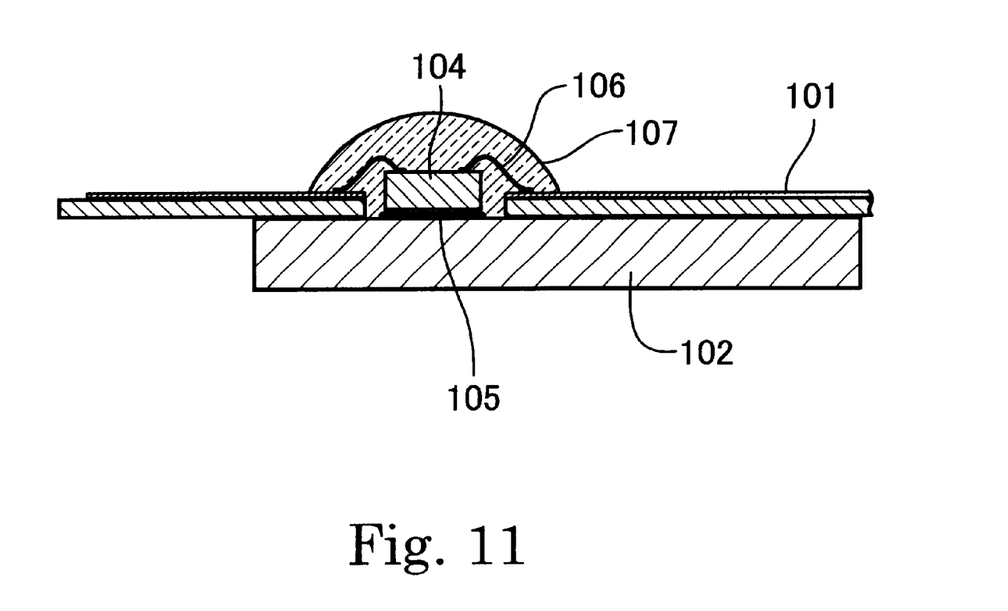
FIG. 11 is a cross-sectional view of a feature of a conventional display driver module.

This plasma display has a large number of driver integrated circuits for leading display signals to a plasma display panel and is controlled and driven by a display driver module which received control signals from a control board. This is the same with a display device using a liquid crystal panel, being a flat display. FIGS. 10 and 11 show the structure of such a conventional display driver module.

FIG. 10 is a perspective view showing an example of a conventional display driver module. FIG. 11 is a cross-sectional view of a feature of a conventional display driver module.

A conventional display driver module with integrated circuit chips, which generate much heat, on it uses a flexible wiring board 101 with a wiring pattern (not shown) formed on its top, to the bottom of which an aluminum plate 102 for radiating heat is attached.

A hole 103 is made at an integrated circuit chip mounting portion (die bonding portion) in the flexible wiring board 101. An integrated circuit chip 104 for a driver is attached through the hole 103 directly to the aluminum plate 102 for radiating heat by the use of an adhesive 105. An electrode on the integrated circuit chip 104 and a copper pattern for wiring on the flexible wiring board 101 are connected with a gold wire 106 by wire bonding, and then the integrated circuit chip 104 is coated with resin 107.

An input electrode portion 108 for connecting to a control board is formed at one end of the flexible wiring board 101 and an output electrode portion 109 for connecting to a plasma display panel is formed at the opposite end.

A display driver module having such a structure uses the flexible wiring board 101 with the aluminum plate 102 for radiating heat attached to it. This structure results in a high cost. Therefore, it is suggested that a metal chassis on a display should be used as a radiator for the integrated circuit chip 104.

Furthermore, the integrated circuit chip 104 for a driver and a wiring pattern on the flexible wiring board 101 are connected by wires which are stretched one by one with a wire bonder. With an increase in production, however, the productivity of such wire bonding is becoming an issue, as with liquid crystal panels ahead of plasma display panels. That is to say, if there are a large number of terminals on which wire bonding must be performed, a wire bonding process will take much time. Furthermore, many wire bonders are necessary for mass production, resulting in a high equipment investment cost. Therefore, flip chip bonding suitable for mass production is attempted.

In some examples of the flip chip connection, an anisotropic conductive resin is used as the most economical structure. It is discussed in Japanese Patent Laid-Open Publication No.Hei9-244047, Japanese Patent Laid-Open Publication No.Hei9-146110, Japanese Patent Laid-Open Publication No.Hei7-211423, etc., in which it is used primarily for a liquid crystal panel. It is also applied to a printed circuit board, of course. Japanese Patent Laid-Open Publication No.Hei11-67832 discloses such an example.

Figure 12A:
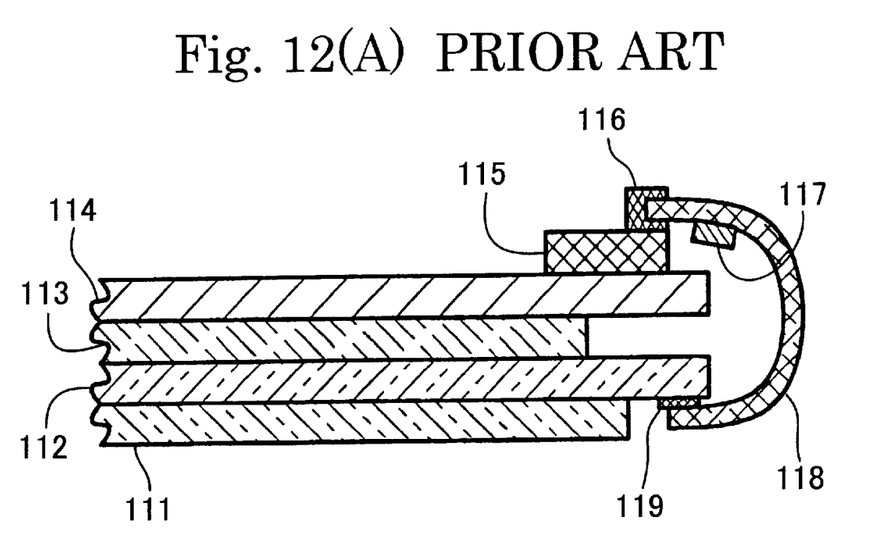
FIGS. 12(A) and 12(B) are fragmentary cross-sectional views showing a schematic of a mounting structure for a conventional display driver module, FIG. 12(A) being a fragmentary cross-sectional view of its feature, and FIG. 12(B) being an enlarged cross-sectional view of its integrated circuit mounted portion.
Figure 12B:
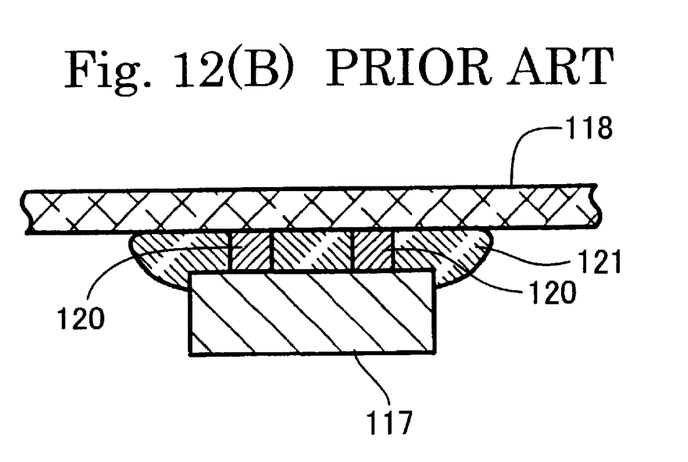

FIGS. 12(A) and (B) are fragmentary cross-sectional views showing a schematic of a mounting structure for a conventional display driver module. FIG. 12(A) is a fragmentary cross-sectional view of its feature. FIG. 12(B) is an enlarged cross-sectional view of its integrated circuit mounted portion.

With a plasma display panel, an X-side sustain circuit board for controlling and driving an X electrode on its front panel, a Y-side sustain circuit board for controlling and driving a Y electrode on its front panel, and a logic circuit board for controlling and driving an address (A) electrode on its back panel are signal processing circuits connected to it. The X-side sustain circuit board is connected to the plasma display panel via a flexible wiring board. Each of the Y-side sustain circuit board and the logic circuit board is connected to the plasma display panel via a display driver module, being a flexible wiring board with a driver integrated circuit mounted on it. Connections formed by these display driver modules and the plasma display panel have the same structure. In addition, connections formed by these display driver modules and the signal processing circuits also have the same structure. In FIG. 12, therefore, an address driver module which connects the logic circuit board and the A electrode is shown as an example.

A plasma display panel consists of a front panel 111 and a back panel 112, which are supported with an aluminum chassis 114 via an adhesive sheet 113. An address bus board 115 for connecting the aluminum chassis 114 and a logic circuit board is placed on the aluminum chassis 114. A connector 116 is placed on the address bus board 115.

An address driver module consists of an address integrated circuit 117 and a flexible wiring board 118. One wiring end of the flexible wiring board 118 is connected to the address bus board 115 by the connector 116 and the other wiring end of the flexible wiring board 118 is connected to an A electrode on the back panel 112 by an anisotropic conductive film (ACF) 119 into which conductive particles are mixed.

The address integrated circuit 117 is connected to the flexible wiring board 118 by the eutectic soldering of gold bumps 120 formed on a circuit-formed surface of the address integrated circuit 117 and tin (not shown) on copper wiring formed on the flexible wiring board 118. A portion around the connection is filled with an underfiller 121.

As stated above, in a conventional mounting structure for a display driver module, the flexible wiring board 118 and the plasma display panel are connected by the anisotropic conductive film 119 and the flexible wiring board 118 and the signal processing circuit are connected by the connector 116. An ampere-level powerful electric current which runs through a power-supply terminal of the address integrated circuit 117 must be handled. Furthermore, the address integrated circuit 117 must be replaced when it fails. If these things are taken into consideration, it is rational to use the connector 116.

Even in a conventional display driver module in which bonding time is taken into consideration, however, an integrated circuit chip with bump electrodes on it is facedown-bonded to a flexible wiring board and a joint formed by them is solidified with an underfiller. The process for connected them therefore takes much time.

Furthermore, in a mounting structure especially for a conventional scan or address display driver module, a connection at gold bumps formed by a driver integrated circuit and a flexible wiring board, in the display driver module, is filled with an underfiller, an anisotropic conductive film is used at a connection formed by the display driver module and a plasma display panel, and a connector is used at a connection formed by the display driver module and a signal processing circuit. That is to say, these three connections differ in mounting structure. This results in a complex structure and an increase in the number of the types of materials used at the connections.

SUMMARY OF THE INVENTION

In order to address such problems, the present invention was made. In other words, an object of the present invention is to provide a low-cost display driver module in which a metal chassis on a display with an integrated circuit chip mounted on it is used as a radiator for the integrated circuit chip, which shortens the process for connecting the integrated circuit chip and a wiring pattern on a flexible wiring board, and which uses the metal chassis on a display panel as a radiator.

Another object of the present invention is to provide a mounting structure for a display driver module in which the structure of connections for a scan and address driver module for a plasma display is simplified.

In order to achieve the first object, a display driver module for driving a flat panel display is provided. This display driver module comprises a flexible wiring board on which a wiring pattern is formed and one or more integrated circuit chips with bump electrodes for driving a display which have one surface the bump electrodes are formed on and the other surface fixed onto the flat panel display so as to adhere to a metal chassis on a display panel and which are bonded to the flexible wiring board by joining, with pressure applied, the bump electrodes to the wiring pattern with one film or paste selected from a group consisting of an anisotropic conductive film, an anisotropic conductive paste, a non-conductive resin paste, and a non-conductive resin film between.

Furthermore, in order to achieve the second object described above, a mounting structure for a display driver module in which a driver integrated circuit for driving a plasma display panel by receiving signals from a drive circuit board and a display driver module having a wiring board on which the driver integrated circuit is mounted are fitted on the plasma display panel is provided. In this mounting structure for a display driver module, a gap between the wiring board and the driver integrated circuit connected to the wiring board via gold projections formed on connection electrodes, in the display driver module, is filled with an insulating resin, a portion around a joint formed by a connection pad at the wiring edge of the wiring board and a connection pad on the plasma display panel at a connection formed by the display driver module and the plasma display panel is filled with the insulating resin, and a portion around a joint formed by a connection pad at the wiring edge of the wiring board and a connection pad on the drive circuit board at a connection formed by the display driver module and the drive circuit board is filled with the insulating resin.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings.

Figure 1:
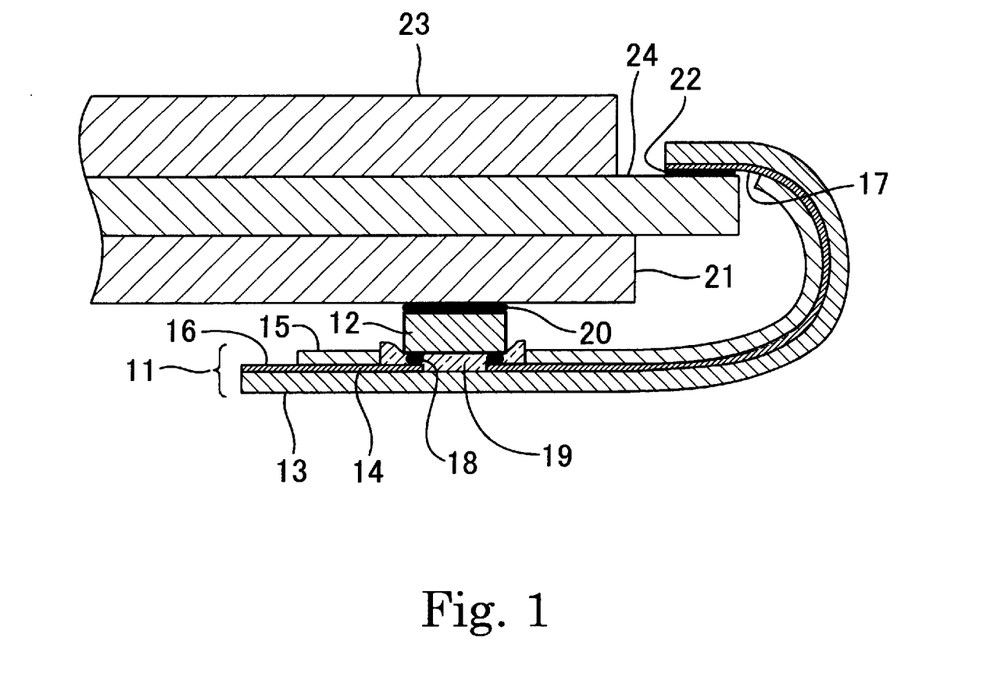
FIG. 1 is a cross-sectional view showing a heat radiation structure for a display driver module according to a first embodiment of the present invention.
Figure 2:
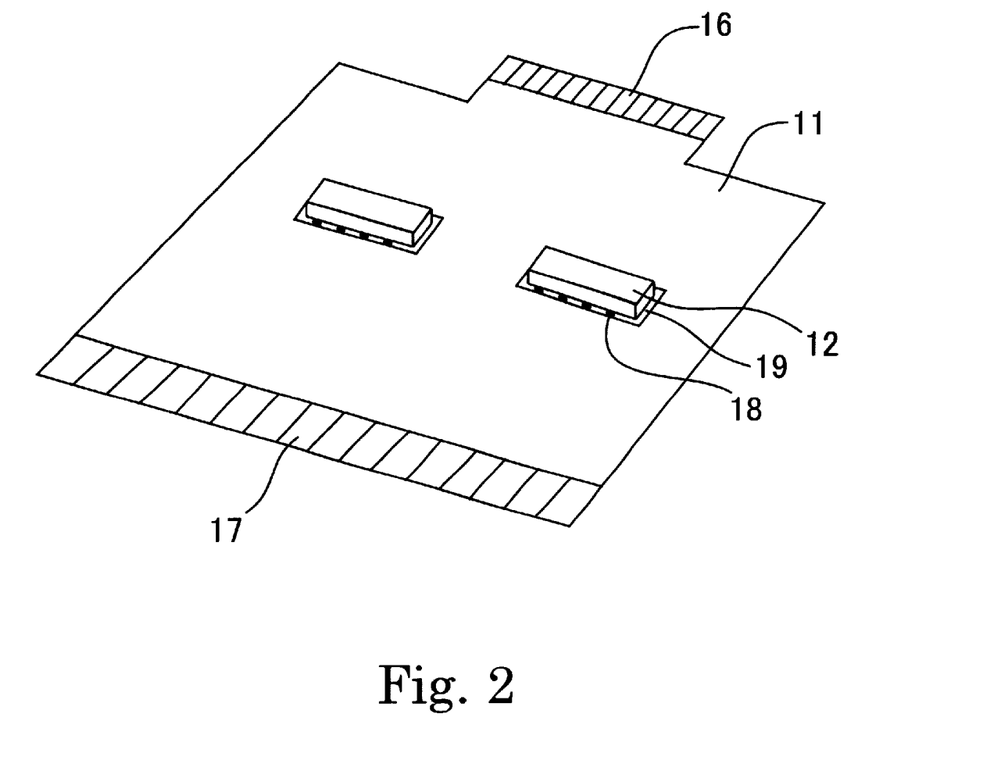
FIG. 2 is a perspective view of a display driver module according to the first embodiment of the present invention.

FIG. 1 is a cross-sectional view showing a heat radiation structure for a display driver module according to a first embodiment of the present invention. FIG. 2 is a perspective view of a display driver module according to the first embodiment of the present invention.

As shown in FIG. 2, a display driver module comprises a flexible wiring board 11 and at least one integrated circuit chip 12. In the flexible wiring board 11, a copper pattern 14 for wiring is formed on a base film 13 and is covered with a cover lay 15. However, locations where an input electrode portion 16 connected to a control board, an output electrode portion 17 connected to a display panel, and the integrated circuit chip 12 are mounted are not coated and therefore exposed. Furthermore, a bump electrode 18 is fitted on each of the integrated circuit chips 12.

A display driver module is formed by joining, with pressure applied, the integrated circuit chip 12, with its surface having the bump electrode 18 down, to an integrated circuit chip connection portion on the copper pattern 14 formed on the flexible wiring board 11 with an anisotropic conductive film 19 between and without an wire.

A display driver module formed in this way is fitted on a display panel. That is to say, as shown in FIG. 1, the back of the integrated circuit chip 12 is attached directly to a metal chassis 21 of, for example, aluminum of the display panel with a liquid or sheet-type integrated circuit chip adhesive 20. The output electrode portion 17 on the flexible wiring board 11 is connected to a connection portion on a back panel 24 of the display panel placed between the metal chassis 21 of the display panel and a front panel 23 of the display panel with an anisotropic conductive film 22.

A heat radiation structure in which the back of the integrated circuit chip 12 is attached directly to the metal chassis 21 of the display panel and in which the metal chassis 21 is used as a radiator for the integrated circuit chip 12 is adopted. This enables to use a low-cost flexible wiring board 11 without an aluminum plate for radiating heat as a display driver module. Furthermore, bonding time can be shortened by joining the integrated circuit chips 12 to such a flexible wiring board 11 by batch bonding.

Figure 3:
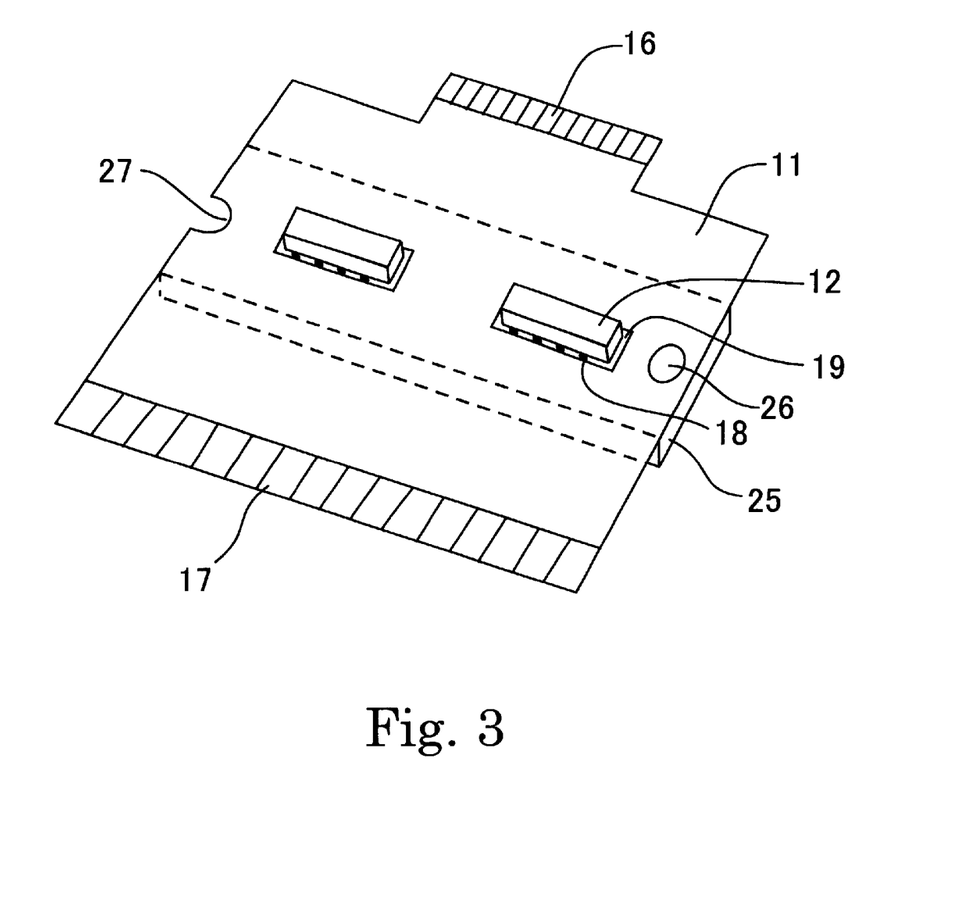
FIG. 3 is a perspective view of a display driver module according to a second embodiment of the present invention.
Figure 4:
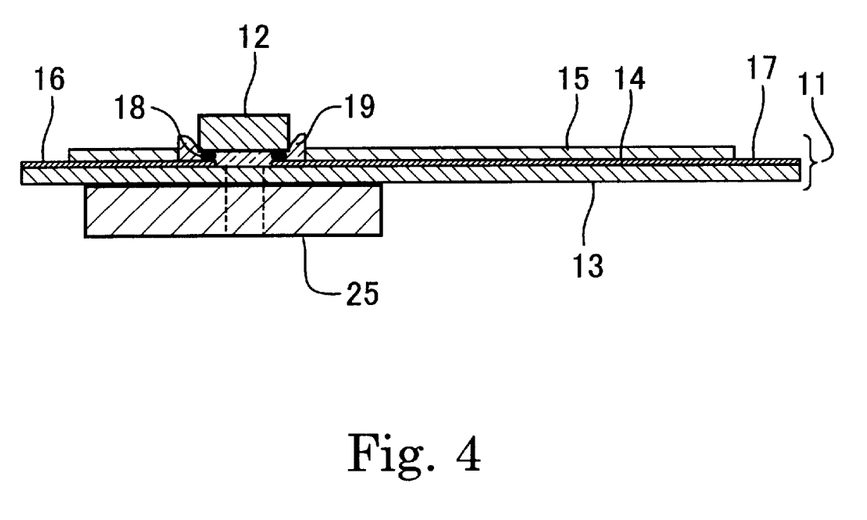
FIG. 4 is a cross-sectional view of a feature of a display driver module according to the second embodiment of the present invention.
Figure 5:
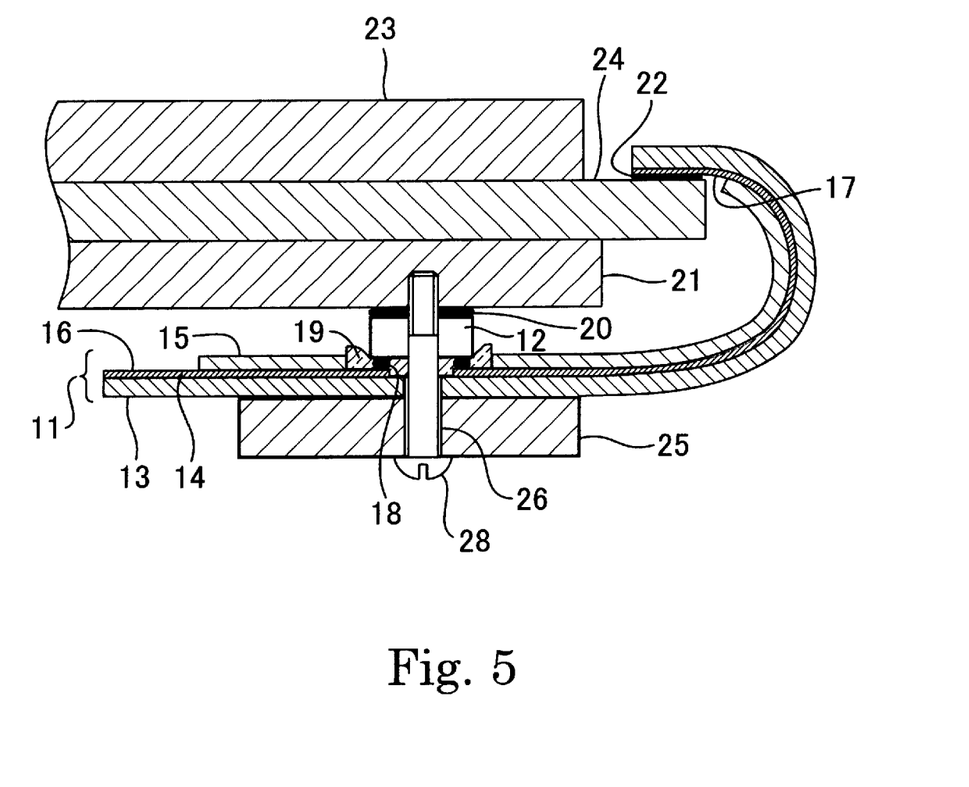
FIG. 5 is a cross-sectional view showing a heat radiation structure for a display driver module according to the second embodiment of the present invention.

FIG. 3 is a perspective view of a display driver module according to a second embodiment of the present invention, FIG. 4 is a cross-sectional view of a feature of a display driver module according to the second embodiment of the present invention, and FIG. 5 is a cross-sectional view showing a heat radiation structure for a display driver module according to the second embodiment of the present invention. Elements in these figures which are the same as those shown in FIGS. 1 and 2 are marked with the same symbols.

As shown in FIG. 3, a display driver module comprises a flexible wiring board 11, at least one integrated circuit chip 12, and a fitting member 25 used to fit the display driver module on a display panel. In the flexible wiring board 11, a copper pattern 14 for wiring is formed on a base film 13 and is covered with a cover lay 15. However, locations where an input electrode portion 16 connected to a control board, an output electrode portion 17 connected to a display panel, and the integrated circuit chip 12 are mounted are not coated and therefore exposed. A bump electrode 18 is fitted on each of the integrated circuit chips 12. The fitting member 25 has a hole portion 26 and/or a notch portion 27 for fitting the display driver module on the display panel with, for example, a screw or pin and is attached to a surface of the flexible wiring board 11 opposite to the one on which the integrated circuit chip 12 is mounted. This fitting member 25 can be metallic or plastic.

As shown in FIG. 4, a display driver module is formed by joining, with pressure applied, the integrated circuit chip 12, with its surface having the bump electrode 18 down, to an integrated circuit chip connection portion on the copper pattern 14 formed on the flexible wiring board 11 with an anisotropic conductive film 19 between and by attaching the fitting member 25 to a surface of the flexible wiring board 11 opposite to the one on which the integrated circuit chip 12 is mounted.

A display driver module formed in this way is fitted on a display panel. That is to say, as shown in FIG. 5, the back of the integrated circuit chip 12 is attached directly to a metal chassis 21 of, for example, aluminum of the display panel with a liquid or sheet-type integrated circuit chip adhesive 20. Then fixing screws 28 are inserted into the hole portion 26 and the notch portion 27 made in the fitting member 25 and are screwed in to the metal chassis 21. By doing so, the integrated circuit chip 12 is joined, with pressure applied, to the metal chassis 21 via the fitting member 25 and this display driver module is fixed onto the metal chassis 21. Furthermore, the output electrode portion 17 on the flexible wiring board 11 is connected to a connection portion on a back panel 24 of the display panel placed between the metal chassis 21 of the display panel and a front panel 23 of the display panel with an anisotropic conductive film 22.

With such a display driver module, the integrated circuit chips 12 are joined to the flexible wiring board 11 without an aluminum plate by batch bonding. As a result, a low-cost display driver module which cuts down bonding time can be provided.

Figure 6A:
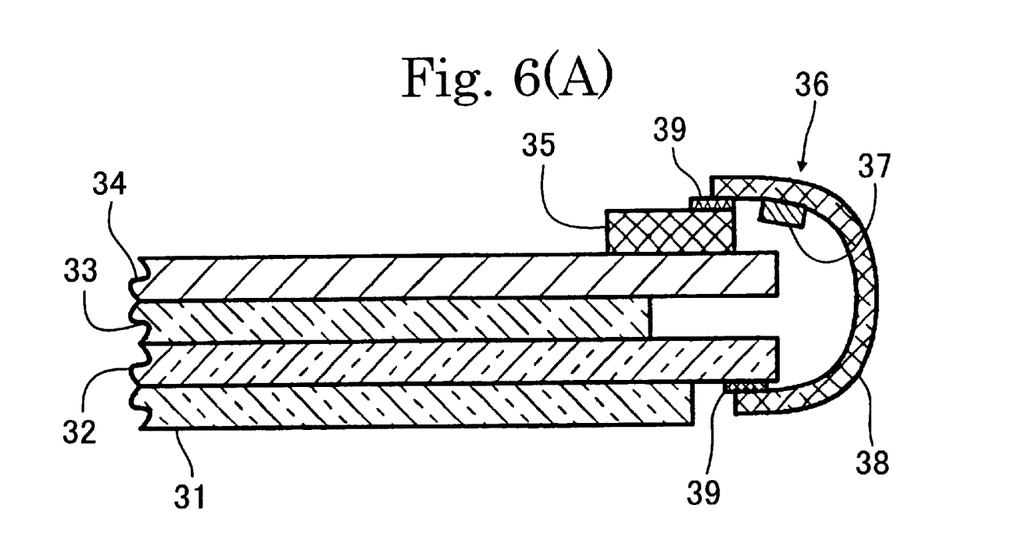
FIGS. 6(A) and 6(B) are schematic views showing the way in which a display driver module is mounted on a plasma display panel, FIG. 6(A) being a fragmentary cross-sectional view showing its feature, and FIG. 6(B) being an enlarged cross-sectional view of an integrated circuit mounted portion.
Figure 6B:
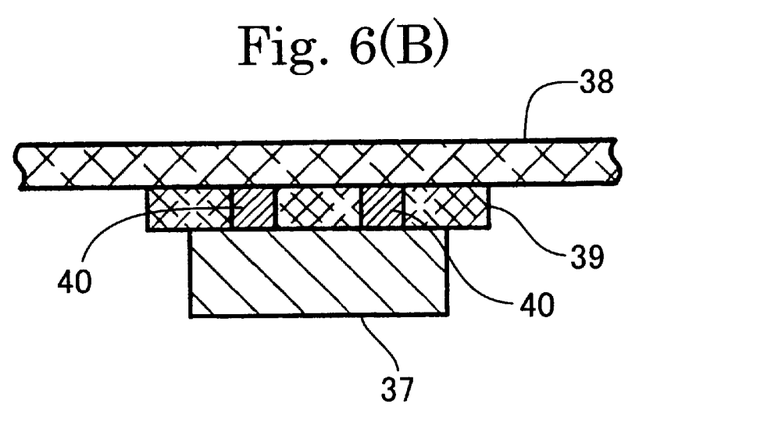

FIGS. 6(A) and 6(B) are schematic views showing the way in which a display driver module is mounted on a plasma display panel. FIG. 6(A) is a fragmentary cross-sectional view showing its feature. FIG. 6(B) is an enlarged cross-sectional view of an integrated circuit mounted portion.

A plasma display panel has a front panel 31 and a back panel 32. These two glass plates are placed at a predetermined distance so as to form rooms for plasma light emission. The front panel 31 and back panel 32 are mechanically supported with an aluminum chassis 34 via an adhesive sheet 33. A bus board 35 connected to a scan or address drive circuit board is fitted on the aluminum chassis 34.

A display driver module 36 comprises a driver integrated circuit 37 and a flexible wiring board 38. At a connection formed by the display driver module 36 and the back panel 32 of the plasma display panel, a portion around a joint formed by a connection pad at the wiring edge of the flexible wiring board 38 and a connection pad on the back panel 32 of the plasma display panel is filled up with an insulating resin 39. Furthermore, at a connection formed by the display driver module 36 and the bus board 35 connected to the drive circuit board, a portion around a joint formed by a connection pad at the wiring edge of the flexible wiring board 38 and a connection pad on the bus board 35 is filled up with the insulating resin 39.

Moreover, in the display driver module 36, as shown in FIG. 6(B), the driver integrated circuit 37 and the flexible wiring board 38 are connected by gold projections formed on a connection electrode on the driver integrated circuit 37, that is to say, by gold bumps 40 and a gap between the driver integrated circuit 37 and the flexible wiring board 38 is filled up with the insulating resin 39.

As described above, all of the three connections formed by the connection pad on the flexible wiring board 38 and the connection pad on the plasma display panel, by the connection pad on the flexible wiring board 38 and the connection pad on the bus board 35 connected to the drive circuit board, and by the driver integrated circuit 37 and the flexible wiring board 38 are filled with the same insulating resin 39. As a result, the structure of these connections will be simplified.

Now, descriptions will be given with an embodiment where an anisotropic conductive film into which conductive particles are mixed is applied as the insulating resin 39 as an example.

Figure 7:
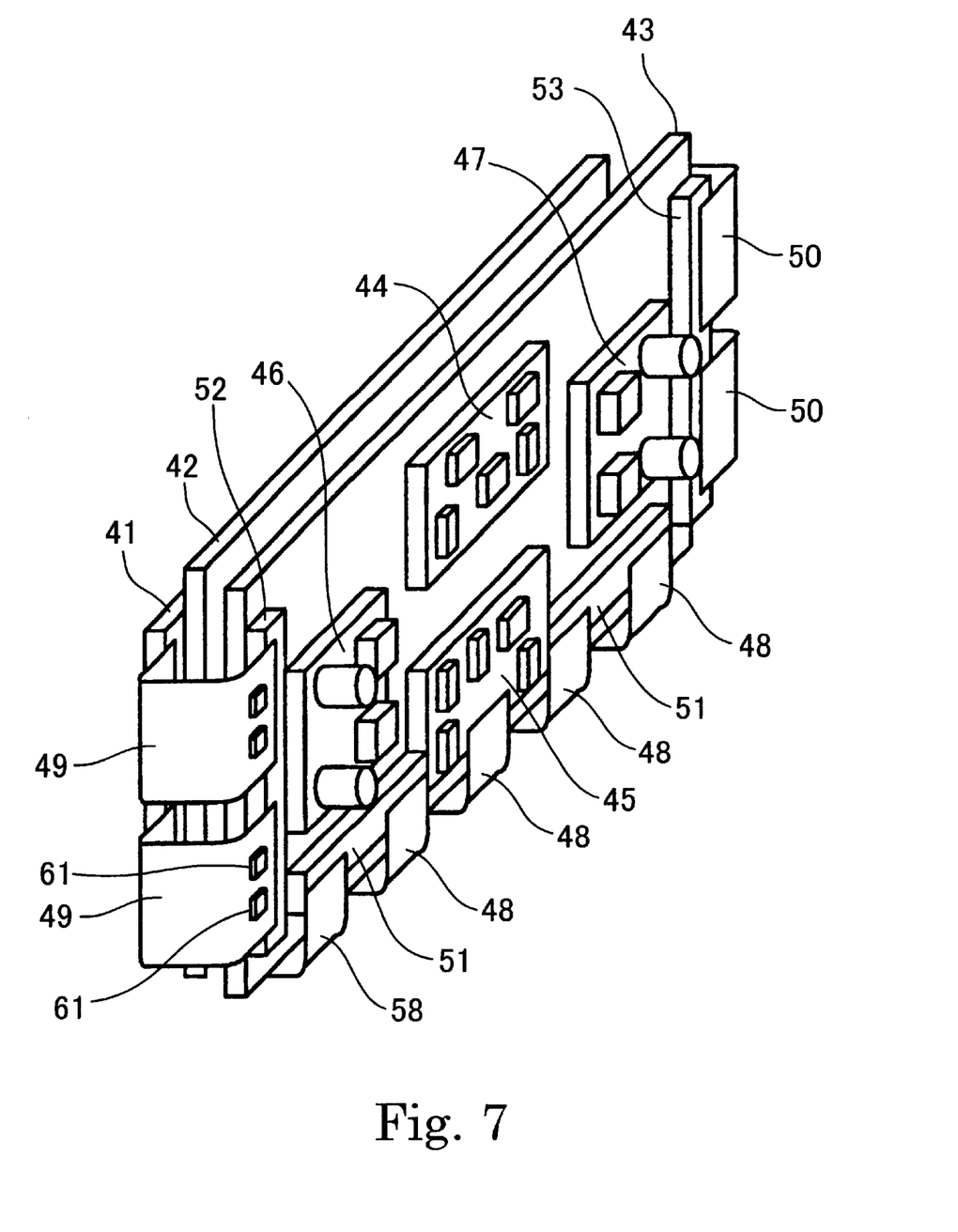
FIG. 7 is a perspective view of a plasma display from the rear of its panels.

FIG. 7 is a perspective view of a plasma display from the rear of its panels.

A front panel 41 is at the front of a product, such as a television, to which this plasma display is applied. In this embodiment, a plasma display with a 42-in. wide screen is used. That is to say, the size of this screen along the diagonal line is a little less than 110 centimeters.

A back panel 42 is placed behind the front panel 41. The front panel 41 and back panel 42 are made of glass. They are placed at a distance of about 0.1 mm. A gap between them is depressurized and a plurality of compartments for plasma light emission are formed. The number of the compartments is 480×2556 (852×3 primary colors) and they are arranged on a grid.

In a plasma display panel in this embodiment, there are three electrodes for every pixel. There are an X electrode and a y electrode on the front panel 41; there is an address (A) electrode on the back panel 42.

The two glass panels of the front panel 41 and back panel 42 are mechanically supported with one aluminum plate, or an aluminum chassis 43, having a thickness of 1 mm.

The aluminum chassis 43 also mechanically supports a drive circuit for the plasma display on its back (this side, in FIG. 7). That is to say, a power-supply circuit board 44 located in the upper middle of the aluminum chassis 43, a logic circuit board 45 located in the lower middle of the aluminum chassis 43, a Y-side sustain circuit board 46 located on the left-hand side of the aluminum chassis 43, and an X-side sustain circuit board 47 located on the right-hand side of the aluminum chassis 43 are mechanically supported on the aluminum chassis 43.

The power-supply circuit board 44 uses voltage supplied from the outside to generate voltage needed within it. The logic circuit board 45 converts image signals to signals for plasma light emission and supplies them to each pixel. The Y-side sustain circuit board 46 and the X-side sustain circuit board 47 supply power for plasma light emission as a pair.

In a drive circuit in a plasma display device having such a structure, image signals are stored with a Y electrode and an A electrode and are displayed with an X electrode and the Y electrode. In order to cause each pixel to store an image signal, display driver modules having a driver integrated circuit are used. A display driver module connected to the A electrode is referred to as an address driver module 48. A display driver module connected to the Y electrode is referred to as a scan driver module 49. The X-side sustain circuit board 47 is connected to the X electrode by an X flexible wiring board 50. In this case, a driver integrated circuit is not used.

An address bus board 51 as a relay board is located between the address driver module 48 and the logic circuit board 45. A Y bus board 52 as a relay board is located between the scan driver module 49 and the Y-side sustain circuit board 46. An X bus board 53 as a relay board is located between the X flexible wiring board 50 and the X-side sustain circuit board 47. The address bus board 51, the Y bus board 52, and the X bus board 53 are fitted on the aluminum chassis 43.

Mounting structures for the address driver module 48 and the scan driver module 49 will now be described in detail. The structure of a connection formed by the address driver module 48 and the back panel 42 is basically the same as that of a connection formed by the scan driver module 49 and the front panel 41. In addition, the structure of a connection formed by the address driver module 48 and the address bus board 51 is basically the same as that of a connection formed by the scan driver module 49 and the Y bus board 52. Therefore, the structure of the connections for the address driver module 48 will be described.

Figure 8:
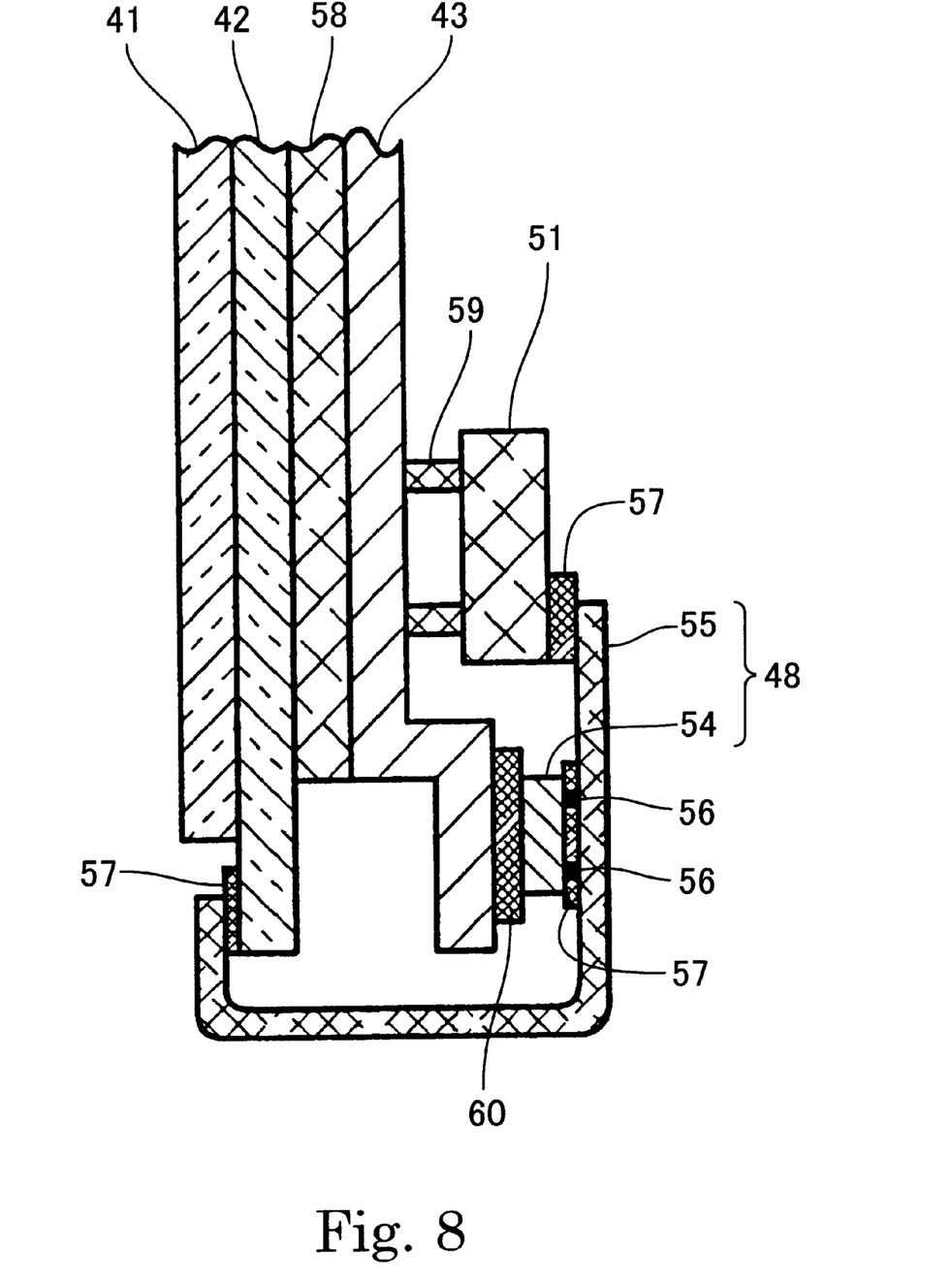
FIG. 8 is an enlarged fragmentary cross-sectional view of a portion around an address driver module.

FIG. 8 is an enlarged fragmentary cross-sectional view of a portion around the address driver module 48.

The address driver module 48 comprises an address integrated circuit 54 and a flexible wiring board 55 on which the address integrated circuit 54 is mounted. The address integrated circuit 54 is connected to the flexible wiring board 55 via gold bumps 56 formed on a circuit-formed surface of the address integrated circuit 54. In this case, an anisotropic conductive film 57 is used to connect them.

The anisotropic conductive film 57 is an insulating resin in which conductive particles are dispersed. When the anisotropic conductive film 57 is pressed against a wiring terminal (not shown) on the flexible wiring board 55 by the gold bumps 56, the dispersed particles cohere and it acquires conductivity. The anisotropic conductive film 57 is also used to connect the flexible wiring board 55 and the back panel 42. Furthermore, the anisotropic conductive film 57 is used to connect the flexible wiring board 55 and the address bus board 51.

An adhesive sheet 58 is used to support the front panel 41 and the back panel 42 with the aluminum chassis 43. The address bus board 51 is supported with an insulating bar 59 so that the address bus board 51 (or more specifically, a printed circuit board) will not touch the aluminum chassis 43. A surface on the address integrated circuit 54 opposite to the circuit-formed surface is joined to the aluminum chassis 43 with a heat conduction sheet 60 between so that heat generated by the address integrated circuit 54 will be radiated from the aluminum chassis 43. Some driver integrated circuits do not need to radiate heat. Such a driver integrated circuit does not need to be thermally joined to the aluminum chassis 43, so it may be mounted on the outer surface of the flexible wiring board 55 which does not face the aluminum chassis 43, of course. This is the same with, for example, a scan integrated circuit 61 mounted on the scan driver module 49 shown in FIG. 7.

A feature is that, around the address driver module 48, the anisotropic conductive film 57 is used at all of the three connections formed by the flexible wiring board 55 and the address integrated circuit 54, by the flexible wiring board 55 and the back panel 42, and by the flexible wiring board 55 and the address bus board 51. This will simplify structure and reduce the number of the types of material used.

As stated above, the flexible wiring board 55 and the address bus board 51 are not connected with a connector, but they are joined by the use of the anisotropic conductive film 57. By the way, for example, the address integrated circuit 54 can be defective. In such a case, it is more difficult to detach and replace the address integrated circuit 54 than where the flexible wiring board 55 and the address bus board 51 are connected with a connector. In this case, the flexible wiring board 55 and the back panel 42 which are connected in the same way must also be separated at the connection. The back panel 42 is made of glass, so the flexible wiring board 55 can be mechanically torn off. However, the address bus board 51 is a printed circuit board and is inferior to glass in mechanical strength. The flexible wiring board 55 therefore cannot be mechanically torn from the address bus board 51.

However, the flexible wiring board 55 and the address bus board 51 can be easily separated at the connection in the same way that is used to separate two things at a soldered portion. That is to say, a connection should be heated partially to about 300° C. By doing so, resin will soften. Therefore, if resin is heated, the flexible wiring board 55 and the address bus board 51 will be separated almost instantaneously. This will leave the residue of resin on a printed circuit board. However, they are reconnected by the use of an anisotropic conductive film in which metal balls are dispersed. These metal balls will break through the residue of the resin used at the original connection and connect with conductive particles. This method will make it easy to replace a defective module.

Furthermore, as a result of joining the flexible wiring board 55 and the address bus board 51 by the use of the anisotropic conductive film 57, the electrical connection portion may be insufficient in current capacity. That is to say, with a plasma display, unlike a liquid crystal display, discharge occurs in a panel, so a powerful electric current runs through a driver integrated circuit. To take the address integrated circuit 54 as an example, an electric current of about 30 mA will run through its output terminal. There is no special problem about this output current value, but an ampere-level electric current will run through its input, power-supply, and earth terminals.

When an electric current is supplied by the use of the gold bumps 56 formed on the circuit-formed surface of the address integrated circuit 54, metal bonding, such as soldering, does not produce the problem of current capacity. However, if the anisotropic conductive film 57 is used for joining, a sufficient conductive area cannot be obtained. A method for meeting the problem of a lack of such current capacity will now be described.

Figure 9:
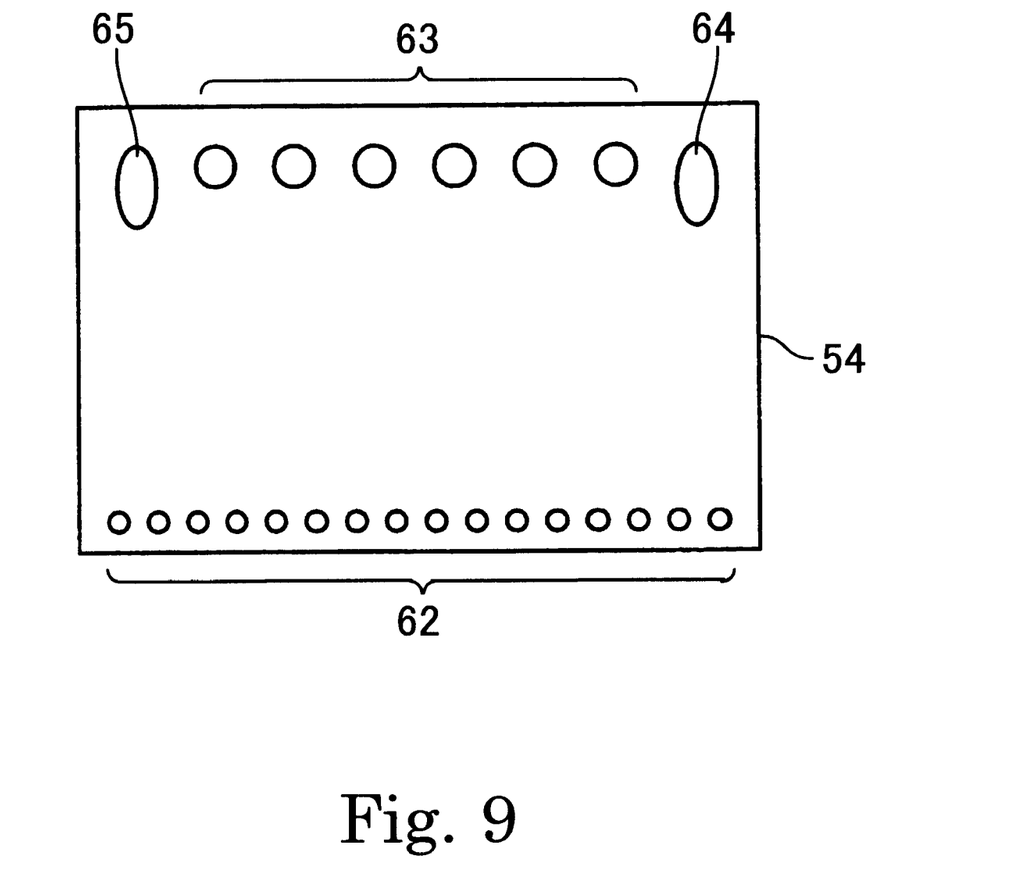
FIG. 9 is a view showing a circuit-formed surface on an address integrated circuit.

FIG. 9 is a view showing a circuit-formed surface on an address integrated circuit.

On the circuit-formed surface of the address integrated circuit 54, output bumps 62, input signal bumps 63, a power-supply bump 64, and an earth bump 65 are formed by plating.

There are tens or hundreds of the output bumps 62 on a driver integrated circuit, like the address integrated circuit 54, so the number of terminals on the output side is great. However, the number of terminals on the input side is extremely small. This is a feature of a driver integrated circuit. As stated above, a weak electric current runs through the output side, so the size of the output bumps 62 may be reduced. The number of terminals on the input side is small, so the size of the input signal bumps 63 can be increased. Similarly, the sizes of the power-supply bump 64 and the earth bump 65 formed correspond to current capacity.

Moreover, the output bumps 62, the input signal bumps 63, the power-supply bump 64, and the earth bump 65 are formed by plating, so their heights are much the same regardless of size. Therefore, they will not adversely affect connection.

While the present invention has been described in detail with reference to preferred embodiments, the present invention is not to be construed as limited to the specific embodiments. Various other modifications and changes may occur to those skilled in the art without departing from the spirit and scope of the present invention.

For example, in the above embodiments, an anisotropic conductive film into which conductive particles are mixed is used as an insulating resin to fill up a portion where an integrated circuit chip is joined to a flexible wiring board with pressure applied and portions around connections. However, an anisotropic conductive paste (ACP), anonconductive resin paste (NCP), or a non-conductive resin film (NCF) can be used instead of an anisotropic conductive film.

Furthermore, in the above embodiments, bumps the sizes of which correspond to current capacity are used as terminals on a driver integrated circuit. However, it is difficult to increase the area of, for example, what is called a stud bump, which is formed by bonding with a gold wire. In such a case, the number of bumps formed can be increased according to current capacity.

As described above, in a display driver module according to the present invention, an integrated circuit chip with bump electrodes on it is joined, with pressure applied, to a flexible wiring board by the use of an anisotropic conductive film, an anisotropic conductive paste, a non-conductive resin paste, or a non-conductive resin film in order to radiate heat which generates from the integrated circuit chip with bump electrodes on it from a metal chassis on a display panel. As a result, tact time is shortened by a batch bonding system. Furthermore, a flexible wiring board without an aluminum plate for radiating heat can be used. This will cut down costs in terms of equipment and material.

Moreover, portions around connections formed by a wiring board and a driver integrated circuit, by the wiring board and a plasma display panel, and by the wiring board and a drive circuit board are filled up with an insulating resin. As a result, these three connections are uniform in their mounting structure. This will simplify structure and reduce the number of the types of material used.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A mounting structure to mount a driver module on a flat panel display, comprising:
    a flexible wiring board on which a wiring pattern is formed and at least one integrated circuit chip with bump electrodes mounted on a first surface of the flexible wiring board;
    a metal chassis attached on a rear surface of the flat panel display; and
    a fitting member to fix the driver module onto the metal chassis such that the driver module is fitted between the fitting member and the metal chassis, wherein:
        the fitting member is arranged on a second surface opposite to the first surface of the flexible wiring board on which the integrated circuit chip is mounted, has a hole or a notch through which a fixing element may pass to fix the driver module to the metal chassis, and fixes the integrated circuit chip to the metal chassis by fitting same, with pressure applied, between the fitting member and the metal chassis.

2. The mounting structure according to claim 1, wherein the integrated circuit chip is attached and fixed to the metal chassis via a liquid or sheet type adhesive.

3. The mounting structure according to claim 1, wherein the integrated circuit chip is bonded to the flexible wiring board by joining, with pressure applied, the bump electrodes to the wiring pattern via one selected from a group consisting of an anisotropic conductive film, anisotropic conductive paste, a non-conductive resin paste and a non-conductive resin film.

4. The mounting structure according to claim 1, wherein the integrated circuit chip with bump electrodes has pads to connect with the wiring board, the contact area of the pads or the number of pads corresponding to the amount of an electric current which flows through the pads.

5. The mounting structure according to claim 1, wherein the flat panel display is a plasma display.

6. The mounting structure according to claim 1, wherein the fitting member has a large area of the extent which covers at least the integrated circuit chip mounting area.

7. A mounting structure used with a flat panel display having a metal chassis, comprising:
    a driver module having a flexible wiring board and at least one integrated circuit chip electrically connected to a first surface of the flexible wiring board, the driver module being fixed between the metal chassis and a fitting member, the fitting member being arranged on a second surface opposite to the first surface of the flexible wiring board on which the integrated circuit chip is electrically connected, and the fitting member having a large area of an extent which covers at least a mounting area of the integrated circuit chip.

* * * * *